United States Patent
Naasani et al.

(10) Patent No.: US 10,217,908 B2
(45) Date of Patent: *Feb. 26, 2019

(54) SEMICONDUCTOR NANOPARTICLE-BASED LIGHT EMITTING MATERIALS (71) Applicant: Nanoco Technologies Ltd., Manchester (GB)

(72) Inventors: Imad Naasani, Manchester (GB); James Harris, Manchester (GB); Nigel Pickett, Manchester (GB)

(73) Assignee: Nanoco Technologies Ltd., Manchester (GB)

( * ) Notice: Subject to any disclaimer, the term of this patent is extended or adjusted under 35 U.S.C. 154(b) by 521 days.

This patent is subject to a terminal disclaimer.

(21) Appl. No.: 13/624,632

(22) Filed: Sep. 21, 2012

(65) Prior Publication Data
US 2013/0075692 A1 Mar. 28, 2013

Related U.S. Application Data (60) Provisional application No. 61/538,301, filed on Sep. 23, 2011.

(30) Foreign Application Priority Data

Sep. 23, 2011 (GB) .................... 1116517.2

(51) Int. Cl.
*H01L 33/50* (2010.01)
*B82Y 20/00* (2011.01)
(Continued)

(52) U.S. Cl.
CPC ............ *H01L 33/504* (2013.01); *B82Y 20/00* (2013.01); *C09K 11/02* (2013.01); *C09K 11/565* (2013.01);
(Continued)

(58) Field of Classification Search
CPC ...................................................... H01L 33/50
(Continued)

(56) References Cited

U.S. PATENT DOCUMENTS 8,361,823 B2 1/2013 Kahen
8,882,299 B2 11/2014 Kinomoto et al.
(Continued)

FOREIGN PATENT DOCUMENTS

EP 2218963 A2 8/2010
JP 2010-126596 6/2010
(Continued)

OTHER PUBLICATIONS

EPO Examination report received in corresponding European patent application No. 12 775 536.1-1551 dated Aug. 29, 2016.

*Primary Examiner* — Peniel M Gumedzoe
*Assistant Examiner* — Christopher A Johnson
(74) *Attorney, Agent, or Firm* — Blank Rome, LLP (57) ABSTRACT A light emitting layer including a plurality of light emitting particles embedded within a host matrix material. Each of said light emitting particles includes a population of semiconductor nanoparticles embedded within a polymeric encapsulation medium. A method of fabricating a light emitting layer comprising a plurality of light emitting particles embedded within a host matrix material, each of said light emitting particles comprising a population of semiconductor nanoparticles embedded within a polymeric encapsulation medium. The method comprises providing a dispersion containing said light emitting particles, depositing said dispersion to form a film, and processing said film to produce said light emitting layer.

3 Claims, 2 Drawing Sheets (51) Int. Cl.
*C09K 11/02* (2006.01)
*C09K 11/56* (2006.01)
*C09K 11/88* (2006.01)
*H01L 33/06* (2010.01)
*H01L 33/52* (2010.01)

(52) U.S. Cl.
CPC ............ *C09K 11/883* (2013.01); *H01L 33/06* (2013.01); *H01L 33/52* (2013.01); *H01L 2933/005* (2013.01); *H01L 2933/0041* (2013.01)

(58) Field of Classification Search
USPC ........................................................ 257/98
See application file for complete search history.

(56) References Cited

U.S. PATENT DOCUMENTS

| | | | |
|---|---|---|---|
| 2004/0150268 A1* | 8/2004 | Garito et al. | 310/12 |
| 2005/0062174 A1* | 3/2005 | Ingle | 257/788 |
| 2006/0157686 A1 | 7/2006 | Jang et al. | |
| 2006/0257485 A1 | 11/2006 | Kumacheva | |
| 2007/0057263 A1 | 3/2007 | Kahen | |
| 2008/0217602 A1 | 9/2008 | Kahen | |
| 2009/0180055 A1* | 7/2009 | Kim | G02F 1/133603 349/69 |
| 2010/0110728 A1* | 5/2010 | Dubrow | C09K 11/025 362/615 |
| 2010/0123155 A1* | 5/2010 | Pickett et al. | 257/98 |
| 2010/0238648 A1* | 9/2010 | Tsukahara | 362/97.1 |
| 2011/0068322 A1 | 3/2011 | Pickett et al. | |
| 2012/0241723 A1 | 9/2012 | Klem et al. | |
| 2012/0320607 A1 | 12/2012 | Kinomoto et al. | |

FOREIGN PATENT DOCUMENTS

| | | |
|---|---|---|
| WO | 2008116079 A1 | 9/2008 |
| WO | 2008226079 A1 | 9/2008 |
| WO | 2009002512 A1 | 12/2008 |
| WO | 2009011922 A1 | 1/2009 |
| WO | 2011-031871 A1 † | 3/2011 |
| WO | 2011-036446 A1 † | 3/2011 |
| WO | 2011036477 A1 | 3/2011 |
| WO | 2011053635 A1 | 5/2011 |
| WO | 2011092646 A2 | 8/2011 |

\* cited by examiner
† cited by third party

SEMICONDUCTOR NANOPARTICLE-BASED LIGHT EMITTING MATERIALS

CROSS REFERENCE TO RELATED APPLICATIONS

This is a non-provisional application which claims priority to U.S. Provisional Application No. 61/538,301 filed Sep. 23, 2011, and to Great Britain Application No. 1116517.2 filed Sep. 23, 2011, the contents of this application is incorporated herein by reference.

FIELD OF THE INVENTION

The present invention relates to semiconductor-based light emitting layers and devices incorporating such layers. The present invention also relates to methods of fabricating such layers.

BACKGROUND OF THE INVENTION

Figure 1:
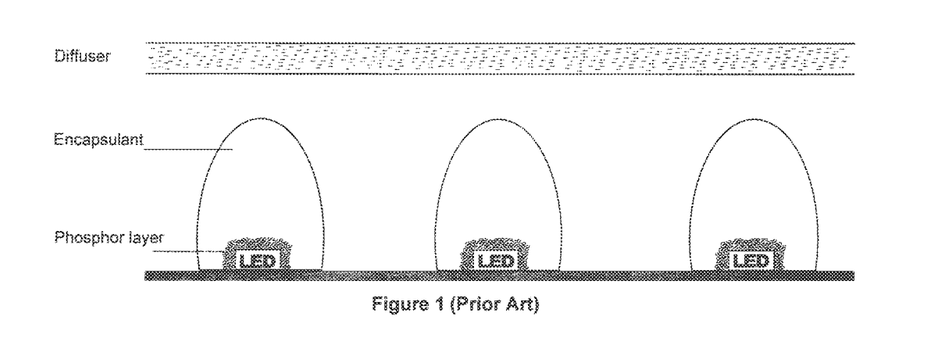
FIG. 1 is a schematic illustration of a prior art back light unit incorporating conventional LEDs.
Figure 2:
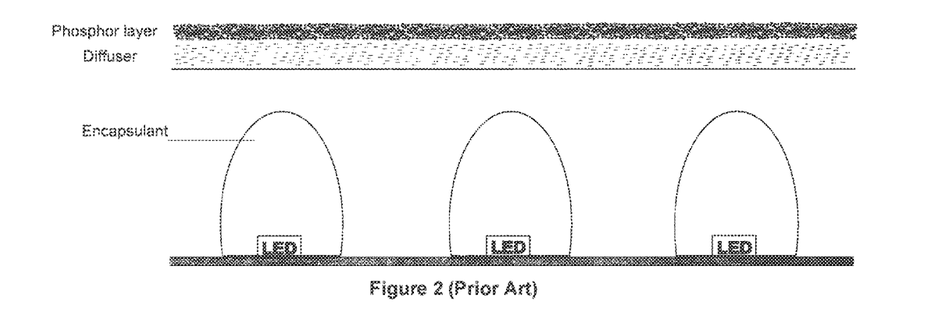
FIG. 2 is a schematic illustration of a prior art back light unit incorporating a light emitting layer, often referred to as a 'phosphor sheet'.
Figure 3:
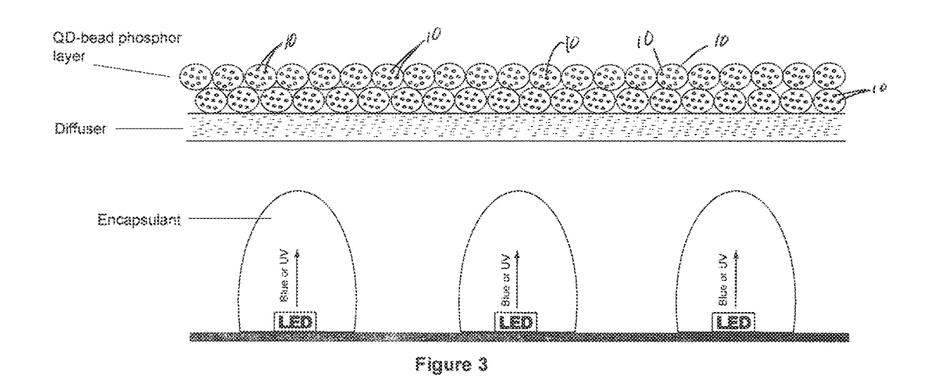
FIG. 3 is a schematic illustration of a first embodiment of a back light unit incorporating light emitting particles comprising a population of semiconductor nanoparticles embedded within a polymeric encapsulation medium ("QD beads") in the form of a phosphor sheet combining a layer of green QD-beads and a layer of red QD-beads in accordance with a preferred embodiment of the present disclosure.
Figure 4:
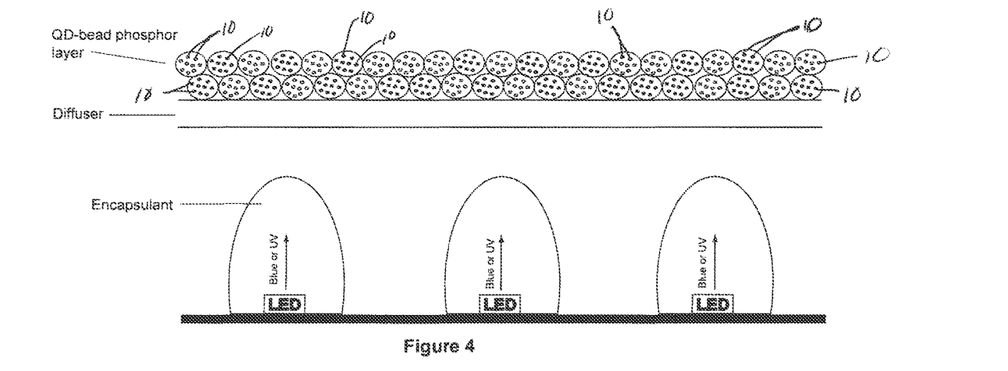
FIG. 4 is a schematic illustration of a second embodiment of a back light unit incorporating a QD-bead phosphor sheet combining green and red QD-beads in the same layer in accordance with another preferred embodiment of the present disclosure.

Conventional backlight units have consisted of a cold cathode fluorescent lamp (CCFL) and a diffuser sheet to give large areas of homogenous white light. Due to energy and size constraints more recently RGB-LEDs have replaced the CCFL light source (FIG. 1). A further development has been to use a blue LED excitation source in combination with a sheet containing a conventional phosphor, such as YAG, whereby the "phosphor layer" or "phosphor sheet" is located near or on top of the diffuser layer and away from the light/excitation source (FIG. 2).

Currently phosphorescent materials used in down converting applications, absorb UV or mainly blue light and convert it to longer wavelengths, with most phosphors currently using trivalent rare-earth doped oxides or halophosphates. White emission is obtained by blending phosphors which emit in the blue, green and red regions with that of a blue or UV emitting solid-state device. i.e. a blue light emitting LED plus a green phosphor such as, $SrGa_2S_4:Eu^{2+}$, and a red phosphor such as, $SrSiEu^{2+}$ or a UV light emitting LED plus a yellow phosphor such as, $Sr_2P_2O_7:Eu^{2+};Mu^{2+}$, and a blue-green phosphor.

Presently white LEDs are made by combining a blue LED with a yellow phosphor however, colour control and colour rendering is poor when using this methodology due to lack of tunability of the LEDs and the phosphor. Moreover, conventional LED phosphor technology uses down converting materials that have poor colour rendering (i.e. colour rendering index (CRI)<75) due to the lack of available phosphor colours.

There has been substantial interest in exploiting the properties of compound semiconductors consisting of particles with dimensions in the order of 2-50 nm, often referred to as Quantum Dots (QDs) or nanocrystals. These materials are of commercial interest due to their size-tuneable electronic properties which can be exploited in many commercial applications such as optical and electronic devices and other applications that now range from biological labeling, photovoltaics, catalysis, light-emitting diodes, general space lighting and electroluminescent displays amongst many new and emerging applications. Two fundamental factors, both related to the size of the individual semiconductor nanoparticle, are responsible for their unique properties. The first is the large surface to volume ratio; as a particle becomes smaller, the ratio of the number of surface atoms to those in the interior increases. This leads to the surface properties playing an important role in the overall properties of the material. The second factor, which affects many materials including semiconductor nanoparticles, is a change in the electronic properties of the materials with size; because of quantum confinement effects the band gap gradually becomes larger as the size of the particle decreases. This effect is a consequence of the confinement of an 'electron in a box' giving rise to discrete energy levels similar to those observed in atoms and molecules, rather than a continuous band as observed in the corresponding bulk semiconductor material. Thus, for a semiconductor nanoparticle, because of the physical parameters, the "electron and hole", produced by the absorption of electromagnetic radiation, a photon, with energy greater then the first excitonic transition, are closer together than they would be in the corresponding macrocrystalline material; moreover the Coulombic interaction cannot be neglected. This leads to a narrow bandwidth emission, which is dependent upon the particle size and composition of the nanoparticle material. Thus, QDs have higher kinetic energy than the corresponding macrocrystalline material and consequently the first excitonic transition (band gap) increases in energy with decreasing particle diameter.

Core semiconductor nanoparticles, which consist of a single semiconductor material along with an outer organic passivating layer, tend to have relatively low quantum efficiencies due to electron-hole recombination occurring at defects and dangling bonds situated on the nanoparticle surface which can lead to non-radiative electron-hole recombinations.

One method to eliminate defects and dangling bonds on the inorganic surface of the QD is to overcoat the nanoparticles with a homogeneous shell of a second semiconductor. This semiconductor material typically has a much wider band-gap than that of the core to suppress tunneling of the charge carriers from the core to the newly formed surface atoms of the shell. The shell material must also have a small lattice mismatch to that of the core material. Lattice mismatch arises primarily because of the differences in bond lengths between the atoms in the core and in the shell. Although the differences in the lattice mismatch between the core and shell materials may only be a few percent it is enough to alter both the kinetics of shell deposition and particle morphology as well as the QY of the resultant particles. Small lattice mismatch is essential to ensure epitaxial growth of the shell on the surface of the core particle to produce a "core-shell" particle with no or minimum defects at the interface that could introduce non-radiative recombination pathways that reduce the PLQY of the particle. One example is a ZnS shell grown on the surface of a CdSe or InP core. The lattice mismatch of some of the most common shell materials relative to CdSe is 3.86% for CdS, 6.98% for ZnSe and 11.2% for ZnS.

Another approach is to prepare a core-multi shell structure where the "electron-hole" pair is completely confined to a single shell layer consisting of a few monolayers of a specific material such as a QD-quantum well structure. Here, the core is of a wide band gap material, followed by a thin shell of narrower band gap material, and capped with a further wide band gap layer, such as CdS/HgS/CdS grown using substitution of Hg for Cd on the surface of the core nanocrystal to deposit just a few monolayers of HgS which is then over grown by a monolayer of CdS. The resulting structures exhibit clear confinement of photo-excited carriers in the HgS layer, which result in a high PLQY and improved photochemical stability.

To add further stability to QDs and help to confine the electron-hole pair one of the most common approaches is to grow thick and robust shell layers around the core. However, because of the lattice mismatch between the core and shell materials, the interface strain accumulates dramatically with increasing shell thickness, and eventually can be released through the formation of misfit dislocations, degrading the optical properties of the QDs. This problem can be circumvented by epitaxially growing a compositionally graded alloy layer on the core as this can help to alleviate the strain at the core-shell interface. For example in order to improve the structural stability and quantum yield of a CdSe core, a graded alloy layer of $Cd_{1-x}Zn_xSe_{1-y}S_y$ can be used in place of a shell of ZnS directly on the core. Because of the gradual change in shell composition and lattice parameters the resulting graded multi-shell QDs are very well electronically passivated with PLQY values in the range of 70-80% and present enhanced photochemical and colloidal stability compared to simple core-shell QDs.

Doping QDs with atomic impurities is an efficient way also of manipulating the emission and absorption properties of the nanoparticle. Procedures for doping wide band gap materials, such as zinc selenide and zinc sulfide, with manganese and copper (ZnSe:Mn or ZnS:Cu), have been developed. Doping with different luminescence activators in a semiconducting nanocrystal can tune the photoluminescence and electroluminescence at energies even lower than the band gap of the bulk material, whereas the quantum size effect can tune the excitation energy with the size of the QDs without having a significant change in the energy of the activator related emission. Dopants include main group or rare earth elements, often a transition metal or rare earth element, such as, $Mn^+$ or $Cu^{2+}$.

The coordination around the atoms on the surface of any core, core-shell or core-multi shell, doped or graded nanoparticle is incomplete and the non-fully coordinated atoms have dangling bonds which make them highly reactive and can lead to particle agglomeration. This problem is overcome by passivating (capping) the "bare" surface atoms with protecting organic groups.

The use of QDs in light emitting devices has some significant advantages over the use of the more conventional phosphors such as the ability to tune the emission wavelength, strong absorption properties and low scattering if the QDs are mono-dispersed. However the methods used so far are challenging due to chemical incompatibility between the outer organic surfaces of the QDs and the types of host materials in which the QDs are supported. QDs can suffer from agglomeration when formulating into these materials and, once incorporated, can suffer from photo-oxidation as a result of the migration of oxygen through the host material to the surfaces of the QDs, which can ultimately lead to a drop in quantum yield. Although reasonable devices can be made under laboratory conditions, there remain significant challenges to replicate this under commercial conditions on a large scale. For example, at the mixing stage the QDs need to be stable to air.

Devices incorporating a light emitting layer where semiconductor QDs are used in place of the conventional phosphors have been described, however, due to problems relating to processability and the stability of the QD-containing materials during and after layer fabrication, the only types of QD material that have been successfully incorporated into such layers are relatively conventional II-VI or IV-VI QD materials, e.g. CdSe, CdS and PbSe. Cadmium and other restricted heavy metals used in conventional QDs are highly toxic elements and represent a major concern in commercial applications. The inherent toxicity of cadmium-containing QDs prevents their use in any applications involving animals or humans. For example recent studies suggest that QDs made of a cadmium chalcogenide semiconductor material can be cytotoxic in a biological environment unless protected. Specifically, oxidation or chemical attack through a variety of pathways can lead to the formation of cadmium ions on the QD surface that can be released into the surrounding environment. Although surface coatings such as ZnS can significantly reduce the toxicity, it may not completely eliminate it because QDs can be retained in cells or accumulated in the body for a long period of time, during which their coatings may undergo some sort of degradation exposing the cadmium-rich core.

The toxicity affects not only the progress of biological applications but also other applications including optoelectronic and communication because heavy metal-based materials are widespread in many commercial products including household appliances such as IT & telecommunication equipment, lighting equipment, electrical & electronic tools, toys, leisure & sports equipment. A legislation to restrict or ban certain heavy metals in commercial products has been already implemented in many regions of the world. For example starting 1 Jul. 2006, the European Union directive 2002/95/EC, known as the "Restrictions on the use of Hazardous Substances in electronic equipment" (or RoHS), banned the sale of new electrical and electronic equipment containing more than agreed levels of lead, cadmium, mercury, hexavalent chromium along with polybrominated biphenyl (PBB) and polybrominated diphenyl ether (PBDE) flame retardants. This law required manufacturers to find alternative materials and develop new engineering processes for the creation of common electronic equipment. In addition, on 1 Jun. 2007 a European Community Regulation came into force concerning chemicals and their safe use (EC 1907/2006). The Regulation deals with the Registration, Evaluation, Authorisation and Restriction of Chemical substances and is known as "REACH". The REACH Regulation gives greater responsibility to industry to manage the risks from chemicals and to provide safety information on the substances. It is anticipated that similar regulations will be extended worldwide including China, Korea, Japan and the US.

There are currently no light emitting layers available that contain heavy metal-free QDs, which can be fabricated at commercially feasible cost and that emit light efficiently in the visible spectrum.

SUMMARY

The disclosure provides light emitting materials and/or methods of fabricating such materials which contain heavy metal-free QDs.

The disclosure provides emitting materials and/or methods of fabricating such materials which can be fabricated at commercially feasible cost.

The disclosure provides light emitting materials and/or methods of fabricating such materials that emit light efficiently in the visible spectrum.

The disclosure provides formulations containing QDs that can be used to fabricate light emitting materials and/or methods of fabricating such materials using said formulations.

The disclosure obviates or mitigates one or more of the problems associated with current light emitting materials and/or methods of fabricating such materials.

According to a first aspect of the disclosure, there is provided a light emitting layer comprising a plurality of light emitting particles embedded within a host matrix material, each of said light emitting particles comprising a population of semiconductor nanoparticles embedded within a polymeric encapsulation medium.

A second aspect of the disclosure provides a method of fabricating a light emitting layer comprising a plurality of light emitting particles embedded within a host matrix material, each of said light emitting particles comprising a population of semiconductor nanoparticles embedded within a polymeric encapsulation medium, the method comprising providing a dispersion containing said light emitting particles, depositing said dispersion to form a film, and processing said film to produce said light emitting layer.

A third aspect of the disclosure provides a light emitting device comprising a light emitting layer in optical communication with a light diffusion layer, said light emitting layer comprising a plurality of light emitting particles embedded within a host matrix material, each of said light emitting particles comprising a population of semiconductor nanoparticles embedded within a polymeric encapsulation medium.

According to a fourth aspect of the disclosure, there is provided a light emitting device comprising a light emitting layer in optical communication with a backlight, said light emitting layer comprising a plurality of light emitting particles embedded within a host matrix material, each of said light emitting particles comprising a population of semiconductor nanoparticles embedded within a polymeric encapsulation medium.

According to a fifth aspect of the disclosure there is provided a dispersion suitable for printing or drop casting on to a substrate, the dispersion comprising light emitting particles dispersed in a host matrix material, each of said light emitting particles comprising a population of semiconductor nanoparticles embedded within a polymeric encapsulation medium.

BRIEF DESCRIPTION OF THE DRAWINGS

For a more complete understanding of the present invention, including features and advantages, reference is now made to the detailed description of the invention along with the accompanying figures:

The following symbols and abbreviations are used in the drawing figures and have the following meanings:

"LED"=a light-emitting diode;
"blue or UV"=the emission wavelength(s) of a light-emitting diode (UV=ultraviolet);
"QD-bead phosphor"=polymer beads containing quantum dots which phosphoresce upon excitation by blue and/or UV light;
"QDs"=quantum dots;
"R"=red-emitting quantum dots;
"G"=green-emitting quantum dots;
"B"=blue-emitting quantum dots;
"white"=white light (i.e., broad-spectrum light);
"blue"=an excitation source emitting predominately blue light.

FIG. 6 is a schematic illustration of how QDs of a single colour (in this case, red, green or blue) can be encapsulated within beads and then the differently coloured QD-beads combined within a device such that the device emits white secondary light when illuminated by a primary light source (in this case a UV light source);

FIG. 7 is a schematic illustration of how QDs of a single colour (in this case, red) can be encapsulated within beads and then incorporated into a device such that the device emits secondary light of the same colour as the QDs when illuminated by a primary light source (in this case an LED chip);

FIG. 8 shows the UV-vis absorption and PL spectra of CdSe/ZnS core/shell QDs in toluene used in the formulation of inks according to aspects of the present disclosure and in the fabrication of phoshor sheets in accordance with other aspects of the present disclosure; and FIG. 9 shows the UV-vis absorption and PL spectra of InP/ZnS core/shell QDs in toluene used in the formulation of inks according to aspects of the present disclosure and in the fabrication of phoshor sheets in accordance with other aspects of the present disclosure.

DETAILED DESCRIPTION

The introduction of semiconductor QDs into the emitting material in accordance with the disclosure brings several advantages. High luminous efficiency can be achieved with a UV light source exciting the QDs which removes the need of filters, hence reducing the loss of light intensity. The colour range attainable in the device is enhanced and can be gradually tuned by varying the size or the composition of the QDs, for example, a range of colours can be obtained from blue to deep red to span the entire visible spectrum by varying the size of CdSe or InP QDs. The size of InAs and PbSe QDs can be tuned to cover most of the near- and middle-infrared regions. QD displays yield more purity in colours than other types of display technologies because QDs exhibit very narrow emission bandwidths and can create pure blue, green, and red to generate all other colours with the results of an improved viewing experience for the end user. By tailoring their synthesis, the QDs can be easily dispersed into aqueous or organic mediums enabling fast and economic device manufacturing with standard printing or other solution-processable techniques; this also provides an opportunity to create printable and flexible devices. There is an increasing interest in the development of flexible emitting substrates to meet the growing demand for low-cost, large-area, flexible and lightweight devices, such as roll-up displays, e-papers, and keyboards.

The semiconductor nanoparticles preferably contain ions selected from group 11, 12, 13, 14, 15 and/or 16 of the periodic table, or said quantum dots contain one or more types of transition metal ion or d-block metal ion. The semiconductor nanoparticles may contain one or more semiconductor material selected from the group consisting of CdS, CdSe, CdTe, ZnS, ZnSe, ZnTe, InP, InAs, InSb, AlP, AlS, AlAs, AlSb, GaN, GaP, GaAs, GaSb, PbS, PbSe, Si, Ge, MgS, MgSe, MgTe and combinations thereof.

The polymeric encapsulation medium is preferably an optically transparent medium comprising a material selected from the group consisting of a polymer, a resin, a monolith, a glass, a sol gel, an epoxy, a silicone and a (meth)acrylate. The polymeric encapsulation medium may comprise a material selected from the group consisting of poly(methyl (meth)acrylate), poly(ethylene glycol dimethacrylate), poly­vinyl acetate), poly(divinyl benzene), poly(thioether), silica, polyepoxide and combinations thereof.

The light emitting particles 10 are preferably discrete microbeads, each microbead incorporating a plurality of said semiconductor nanoparticles. Said microbeads may possess an average diameter of around 20 nm to around 0.5 mm. Some or all of the nanoparticle-containing microbeads may include a core comprising a first optically transparent medium and one or more outer layers of the same or one or more different optically transparent media deposited on said core. The semiconductor nanoparticles may be confined to the core of the microbeads or may be dispersed throughout the core and/or one or more of the outer layers of the microbeads.

In the light emitting layer the host matrix material may be selected from a wide variety of polymers whether organic or inorganic, glass, water soluble or organic solvent soluble, biological or synthetic. For example, the following simple linear chain polymers may be used polyacrylate, polycarbonate, polystyrene, polyethylene, polypropylene, poly ketone, polyether ether ketone, polyesters, polyamide, polyimide, polyacrylamide, polyolefines, polyacetylene, polyisoprene, polybutadiene, PVDF, PVC, EVA, PET, polyurethane, cellulose polymers (e.g., ethylcellulose, isopropylmethylcellulose phthalate, nitrocellulose). Further examples include crosslinked polymers and/or copolymers, triblock copolymers and UV- and thermal curing epoxy. Suitable polymers may be selected from the group consisting of polystyrene/toluene matrix, trimethylol propane trimethacrylate/lauryl methacrylate matrix, trimethylol propane trimethacrylate/lauryl methacrylate/polyisobutylene matrix, trimethylol propane trimethacrylate/lauryl methacrylate/PIPS matrix, isobornyl acrylate/dipropyleneglycol diacrylate matrix, acrylic-polystyrene/toluene matrix, and polycarbonate. Clay materials such as bentonite, kaolin, fumed silica [e.g., CAB-O-SILO® (Cabot Corporation, Boston, Mass. 02210)], fumed alumina, fumed zinc oxide, inorganic polymers can be used as the host matrix medium alone or as additives to organic polymers in order to improve the performance of the final material. The method according to the present disclosure may employ any of the polymers and materials indicated above alone or in combination with one or more other suitable polymers and materials.

In the method of fabricating a light emitting layer the dispersion preferably possesses a viscosity that makes it suitable for deposition by printing or drop casting. Deposition of said dispersion is preferably effected by printing or drop casting. The deposited film may then be processing by doctor blading to form a thin film of consistent thickness over a surface of a substrate. The film may be formed having any desirable thickness but is preferably up to around 250 nm thick. Processing of the film may also comprise annealing, which may involve heating the film one or more times, for example up to a temperature of around 50 to 100° C. Alternatively or additionally, processing of the film may comprise curing by any convenient means.

In the light emitting device comprising a light emitting layer in optical communication with a backlight, it is preferred that the device comprises a light diffusion layer in between said backlight and said light emitting layer.

Fluorescent inks, i.e., inks that emit light under UV or visible irradiation, have been used for a long time in consumer products for a variety of purposes. One of the main reasons is that fluorescent inks produce very bright and saturated colors which can make the product more appealing to the human eye. Many conventional luminescent inks are made by mixing a transparent base ink with various types of fluorescent pigments. Although these pigments can provide the desired degree of luminescence, in many cases due to their ability to scatter the light they can make the ink opaque which is often an undesirable side effect. Opacity becomes an issue when high loadings of pigments are necessary to achieve the desired brightness or when the ink is used as a primary ink to be combined by overprinting to create secondary and tertiary colors. For example, a transparent blue ink that is overprinted on top of a yellow transparent ink will results into a green ink. On the contrary, an opaque blue ink overprinted on top of another ink will hide the underlying ink independently of its color and the final ink will continue to appear blue to the viewer because of its opacity.

Other than for aesthetic purposes, the need for transparent inks can also be appreciated in the case of ultraviolet luminescent inks that are much sought-after in the manufacture of security articles, such as passports, personal identification cards, credit cards, chip-and-pin cards, bank notes and barcode-tracked products. The main purpose of these inks is to introduce one or more distinctive 'secret' codes into the articles in order to make them unique and difficult to counterfeit. The ink must be transparent under the natural light in order to be concealed and becomes visible only as it emits a certain light color upon UV irradiation. Ideally the color of the emitted light can be tuned so that it can be recognized only by a specific electronic device overall making the article less prone to forgery and alteration. The color of the emitted light is not necessarily restricted to the visible range and can include also light emitted in the infrared portion of the spectrum. The conventional phosphor powders currently used in most security luminescent inks have an appreciable particle size (usually in the range of few microns) which causes scattering of the visible light and makes the inks opaque.

Other conventional luminescent inks are made by mixing a transparent base ink with various types of organic fluorescent dyes. These types of inks usually offer high brightness and high transparency but typically suffer from low light and water fastness (i.e., the degree to which a dye resists fading due to light and water exposure), a phenomenon that usually worsens in presence of oxygen. Examples of these organic dyes include xanthene dyes, diphenyl dyes, diphenyl methane dyes, triaryl methane dyes and mixtures thereof. Another important limitation of the organic dyes is that they are characterized by a broad emission spectrum when excited with UV or visible excitation, which limits the number and the purity of the colors available and therefore offer limited protection against counterfeit.

QD-based inks can offer the same level of brightness without the drawbacks of the conventional pigment- or dye-based inks The use of QD has some significant advantages such as the ability to tune the emission wavelength, strong absorption properties and low scattering if the QDs are mono-dispersed. For QD it has been found that they can emit light in any near monochromatic color, with the color of the light emitted being dependent only on the size of the QDs. The QDs can be soluble in solvents and their physical properties can be tailored to be soluble in any type of solvent.

For their use in luminescent inks QDs must be incorporated into an ink medium while remaining fully monodispersed, without significant loss of quantum efficiency. The methods used so far are challenging due to chemical incompatibility between the outer organic surfaces of the QDs and the medium used in the ink which is preferably water or an aqueous-based solvent. This comes from the fact that the surface of the QDs is typically capped with hydrophobic organic ligands which confer very low or no affinity with water. Hydrophilic ligand-capped QDs have better affinity to water-based mediums but often have poorer optical properties than their organic equivalents such as low quantum yield and broad size distribution. Generally, whether they have a hydrophilic- or hydrophobic-surface coating, QDs can still suffer from agglomeration when formulating into these inks and once incorporated migration of oxygen through the ink medium to the surfaces of the QDs can lead to photo-oxidation and cause a decrease in quantum yield. Although reasonable inks can be made under laboratory conditions, there remain significant challenges to replicate this under commercial conditions on a large scale, for example at the mixing stage the QDs need to be stable to air.

The introduction of QDs into a solid state matrix, such as a 'bead material', in accordance with the fifth aspect of the present disclosure is of great advantage. QD-beads can be incorporated into a polymer matrix or medium to form a QD-bead ink by dispersing the desired amount of QD-bead material in the desired amount of a suitable polymer. The resulting composite is mixed thoroughly to provide a homogeneous ink that can be cured according to the specific curing procedure for that particular polymer used and provide a simple and straightforward way of fabricating a luminescent QD-bead ink.

QD-bead inks can offer other advantages over free 'bare' QD-inks By incorporating QDs into stable beads it is possible to protect the otherwise reactive QDs from the potentially damaging surrounding chemical environment. Moreover, by placing a number of QDs into a single bead, the subsequent QD-bead is more stable, than the bare QDs, to mechanical and thermal processing that the QD-ink often must undergo during the fabrication of luminescent products. Additional advantages of QD-containing beads over bare QDs include greater stability to air, moisture and photo-oxidation which might open the possibility of handling QD-inks in air and remove the need of expensive handling processes that require an inert atmosphere thus reducing significantly the manufacturing costs. The size of the beads can be tuned from 50 nm to 0.5 mm in diameter following tailored encapsulation protocols, providing a way to control the ink viscosity. This is very important because the viscosity dictates how an ink flows through a mesh, how it dries, and how well it adheres to a substrate. If the viscosity can be controlled by the size of the beads, then it is possible to eliminate the practice of adding significant amounts of thinner to change the viscosity making the process simpler and less expensive.

Because of the nature of the encapsulation process, not only QD aggregation is prevented yielding a uniform layer, but also the QD surface is not disrupted or drastically modified and the QDs retain their original electronic properties so that the specifications of the QD-bead ink can be controlled tightly. QD-beads permit efficient colour mixing of the quantum dots in the ink because the mixing can be either within the QD-containing beads, i.e. each bead contains a number of different size/colour emitting QDs, or a mixture of differently coloured beads with all the QDs within a specific bead being of the same size/colour, i.e. some beads containing all blue quantum dots, some all green quantum dots and some all red quantum dots.

It is possible to encapsulate hydrophobic coated-QDs into beads composed of a hydrophilic polymer to impart novel surface properties (for example water solubility). This is of particular importance for making water-based QD inks which have many positive qualities and in particular are environmentally friendly. There are many regulations that have identified organic solvents typically used as vehicles in printing inks as hazardous. Hazardous waste regulations restrict disposal options for all wastes mixed with solvents from these inks that are usually of organic in nature (e.g., toluene, ethanol, isopropanol) and highly flammable. The chemicals that derive from the break-down of these wastes are also toxic and special measures (like for example special filters) have to be employed in the printing industry to trap these chemicals and avoid their release in the environment. Water-based inks provide an attractive alternative to these organic solvents and a mean of eliminating both pollution and many of the regulatory constraints on the printing process.

The same concept can be applied to beads composed of oppositely charged polymers, e.g., the bead process can be used to modify the QD surface by switching the surface charge by using an appropriate polymer. QD surface charge is an important parameter in nanotoxicity as it has been observed that a particular charge on the QD surface can trigger the beginning of certain destructive molecular pathways via contact activation. Changing the surface charge via bead encapsulation process can offer a simple method to circumvent this problem.

Thus bead encapsulation can be interpreted as a method for tuning the surface functionality of the QDs via a simple process that avoids the use of harsh experimental conditions and therefore limits the potential damages that can occur to the QDs and offers more choices in terms of the number and types of resins that can be used to disperse and process the QD-beads.

Under specific experimental conditions the bead coating can be selectively modified or removed during/prior certain stages of the ink preparation meaning that the ink can be interpreted as a medium to deliver the QDs. Thus QD-beads represent a way to the controlled release and delivery of QDs which could be important for example to protect the QDs and separate them from incompatible substances during certain stages of the printing process or to increase the affinity of the QDs in a specific ink solvent.

A first preferred embodiment of a QD-bead ink according to the present disclosure comprises green light emitting QD-silica beads in a polystyrene/toluene matrix. A polystyrene/toluene mixture is first formed to which is then added a suitable amount of the QD-beads, in this case InP/ZnS core/shell QD-beads. The resulting mixture is then processed (e.g. heating, mixing etc) to ensure satisfactory dispersion of the QD-bead particles in the polystyrene/toluene mixture to yielded a transparent green QD-bead ink.

A second preferred embodiment of a QD-bead ink according to the present disclosure comprises red light emitting acrylate beads in an LED acrylate matrix. A mixture containing an initiator, Irgacure 819, trimethylol propane trimethacrylate (TMPTM) and lauryl methacrylate is initially formed. InP/ZnS core/shell QD-acrylate beads are then dispersed in the acrylate mixture to yield a red QD-bead ink.

A third preferred embodiment of a QD-bead ink according to the present disclosure comprises red light emitting acrylate beads in a flexible acrylate matrix comprising trimethylol propane trimethacrylate (TMPTM) and polyisobutylene (PIB). In an alternative embodiment, PIB can be substituted with PIPS. A mixture containing an initiator, Irgacure 819, and TMPTM is formed. A separate mixture of PIB and lauryl methacrylate is also formed. The amount of TMPTM used in this embodiment is relatively less than the amount used in the second preferred embodiment to ensure that the acrylate matrix is less crosslinked and therefore more flexible than the acrylate matrix produced in the second preferred embodiment. The two mixtures are then combined to yield a yellowish ink matrix. InP/ZnS core/shell QD-acrylate beads are then dispersed in the yellowish matrix to yield a red QD-bead ink.

QD-bead phosphors can offer several advantages over free 'bare' QD phosphors.

By incorporating QDs into stable beads it is possible to protect the otherwise reactive QDs from the potentially damaging surrounding chemical environment. Moreover, by placing a number of QDs into a single bead, the subsequent QD-bead is more stable, than the bare QDs, to chemical, mechanical, thermal and photo-processing which is required when incoporating QDs in most commercial applications such as down convertor, phosphor materials. Additional advantages of QD-containing beads over bare QDs include greater stability to air, moisture and photo-oxidation which might open the possibility of making QD phosphors processable in air and remove the need of expensive inert atmosphere handling processes thus reducing significantly the manufacturing costs. The size of the beads can be tuned, e.g. from 50 nm to 0.5 mm in diameter, following tailored encapsulation protocols, providing a way to control the ink viscosity and opening the access to a range of inexpensive and commercially available deposition techniques.

Figure 5:
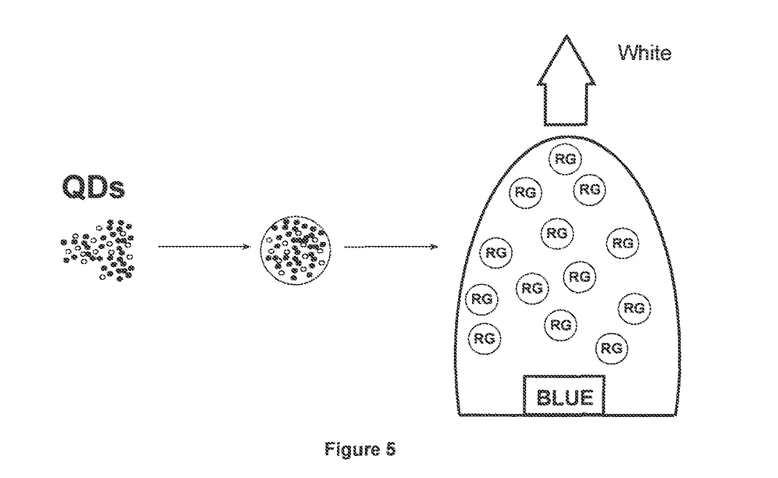
FIG. 5 is a schematic illustration of how multi-coloured (in this case, red and green denoted "RG" in FIG. 5) QDs can be combined within the same bead such that each bead emits white secondary light when illuminated by a primary light source (in this case a blue light source denoted "BLUE" in FIG. 5)

Because of the nature of the encapsulation process, not only QD aggregation is prevented yielding a uniform layer but also the QD surface is not disrupted or drastically modified and the QDs retain their original electronic properties so that the specifications of the QD-bead phosphor can be controlled tightly. QD-beads permit efficient colour mixing of the QDs in the phosphor because the mixing can be either within the QD-containing beads, i.e. each bead contains a number of different size/colour emitting QDs, or a mixture of differently coloured beads with all the QDs within a specific bead being the same size/colour, i.e. some beads containing all green QDs and others containing all red QDs (see FIGS. 5 to 7 below).

It is possible to encapsulate hydrophobic coated-QDs into beads composed of a hydrophilic polymer to impart novel surface properties (for example water solubility). This is of particular importance for making water-based QD inks The same concept can be applied to beads composed of oppositely charged polymers. This can be interpreted as a method for tuning the surface functionality of the QDs via a simple process that avoids the use of harsh conditions and therefore limits the potential damages that can occur to the QDs and can offer more choices in terms of the number and type of available resins that can be used to disperse and process the QD-beads for fabricating phosphor devices.

Bead encapsulation can help reducing the formation of strains that often affect the phosphor sheets made by the conventional encapsulation methods and have a detrimental effect on the optical properties of the sheet. In addition no further film encapsulation is required because the QDs in the film are already encapsulated by the surrounding bead potentially halving the costs of current manufacturing processes that require a final film encapsulation.

Under specific experimental conditions the bead coating can be selectively modified or removed during/prior certain stages of the phosphor sheet preparation meaning that the QD-bead ink can be used as a medium to deliver the QDs. Thus QD-beads represent a way to the controlled release and delivery of QDs which could be important for example for protecting the QDs and separating them from incompatible substances during certain stages of the manufacturing process or for example for dispersing water-insoluble QDs in an aqueous medium more readily.

An important achievement described in the present disclosure is the encapsulation of QDs in an encapsulation medium that confers stability to the QDs but without altering their optical properties and their processability. Embedding colloidal QDs in a host matrix has the major advantage of protecting the QDs from their surrounding chemical environment, air, moisture and oxygen and increasing their photo-stability. However, one of the challenges is to find a transparent host matrix that can act as a conductive layer and be non-emitting e.g., does not interfere with the light emitted by the primary source (e.g LED) and the light emitted by the QDs. The polymer matrix needs to be stable under intense illumination and high energy (i.e. UV source) and for some applications needs to have also some stability at elevated temperatures.

Aspects of the present disclosure relate to QD-bead phosphor sheets made from QD-containing bead architectures and methods of producing QD-bead phosphor sheets.

A first preferred embodiment of a method for fabricating a QD-bead phosphor sheet in accordance with an aspect of the present disclosure employs green silica beads in a polystyrene/toluene matrix. Two spacers are fixed to a polyethylene terephthalate (PET) sheet with a constant gap (e.g. 15 mm) defined between them. A predetermined volume of a QD-bead ink, such as the ink described above in the first preferred embodiment of a QD-bead ink, is then drop cast on to the region of the PET sheet in between the spacers. The ink is then distributed uniformly between the spacers and then heated to remove the solvent. The resulting film exhibited noticeable fluorescence under bright ambient light conditions.

A second preferred embodiment of a method for fabricating a QD-bead phosphor sheet in accordance with an aspect of the present disclosure employs red acrylate beads in an LED acrylate matrix. A predetermined volume of a QD-bead ink (e.g. the ink in accordance with the second preferred embodiment of an ink described above) is drop cast on to a glass mould and then cured to yield a QD-bead polymer film.

A third preferred embodiment of a method for fabricating a QD-bead phosphor sheet in accordance with an aspect of the present disclosure employs red acrylate beads in a flexible acrylate matrix. A predetermined volume of a QD-bead ink (e.g. the ink in accordance with the third preferred embodiment of an ink described above) is drop cast on to a glass mould and then cured to yield a QD-bead polymer film.

All three of the above preferred embodiments successfully produced QD-bead phosphor sheets exhibiting good optical performance.

The current disclosure describes the preparation of a QD phosphor sheet made of QDs embedded into an optically clear and chemically stable medium termed "beads"—the term beads as used herein can mean any three-dimensional shape, constituency or size of material—using a variety of techniques. Preparation of beads can be achieved by several processes including by incorporating the QDs directly into the polymer matrices of resin beads or by immobilizing the QDs in polymer beads through physical entrapment.

In the semiconductor nanoparticle materials employed in the various aspects of the present disclosure the core material may comprise any one or more of the following types of material.

II-IV compounds including a first element from group 12 (II) of the periodic table and a second element from group 16 (VI) of the periodic table, as well as ternary and quaternary materials including, but not restricted to, CdSe, CdTe, ZnS, ZnSe, ZnTe, ZnO, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdHgSeS, CdHgSeTe, CdHgSTe, HgZnSeS, HgZnSeTe.

II-V compounds incorporating a first element from group 12 of the periodic table and a second element from group 15 of the periodic table and also including ternary and quaternary materials and doped materials. Nanoparticle material includes but is not restricted to: $Zn_3P_2$, $Zn_3AS_2Cd_3P_2$, $Cd_3AS_2$, $Cd_3N_2$, $Zn_3N_2$.

III-V compounds including a first element from group 13 (III) of the periodic table and a second element from group 15 (V) of the periodic table, as well as ternary and quaternary materials. Examples of nanoparticle core materials include but are not restricted to: BP, AlP, AlAs, AlSb; GaN, GaP, GaAs, GaSb; InN, InP, InAs, InSb, AN, BN, GaNP, GaNAs, InNP, InNAs, GAInPAs, GaAlPAs, GaAlPSb, GaInNSb, InAlNSb, InAlPAs, InAlPSb.

III-VI compounds including a first element from group 13 of the periodic table and a second element from group 16 of the periodic table and also including ternary and quaternary materials. Nanoparticle material includes but is not restricted to: $Al_2S_3$, $Al_2Se_3$, $Al_2Te_3$, $Ga_2S_3$, $Ga_2Se_3$, $In_2S_3$, $In_2Se_3$, $Ga_2Te_3$, $In_2Te_3$.

IV compounds including elements from group 14 (IV) Si, Ge, SiC and SiGe.

IV-VI compounds including a first element from group 14 (IV) of the periodic table and a second element from group 16 (VI) of the periodic table, as well as ternary and quaternary materials including, but not restricted to, PbS, PbSe, PbTe, SnSeS, SnSeTe, SnSTe, PbSeS, PbSeTe, PbSTe, SnPbSe, SnPbTe, SnPbSeTe, SnPbSTe.

The material of any buffer layer or shell layer(s) grown on the nanoparticle core may include any one or more of the following materials.

IIA-VIB (2-16) material, incorporating a first element from group 2 of the periodic table and a second element from group 16 of the periodic table and also including ternary and quaternary materials and doped materials. Nanoparticle material includes but is not restricted to: MgS, MgSe, MgTe, CaS, CaSe, CaTe, SrS, SrSe, SrTe.

IIB-VIB (12-16) material incorporating a first element from group 12 of the periodic table and a second element from group 16 of the periodic table and also including ternary and quaternary materials and doped materials. Nanoparticle material includes but is not restricted to: ZnS, ZnSe, ZnTe, CdS, CdSe, CdTe, HgS, HgSe, HgTe.

II-V material incorporating a first element from group 12 of the periodic table and a second element from group 15 of the periodic table and also including ternary and quaternary materials and doped materials. Nanoparticle material includes but is not restricted to: $Zn_3P_2$, $Zn_3AS_2$, $Cd_3P_2$, $Cd_3AS_2$, $Cd_3N_2$, $Zn_3N_2$.

III-V material incorporating a first element from group 13 of the periodic table and a second element from group 15 of the periodic table and also including ternary and quaternary materials and doped materials. Nanoparticle material includes but is not restricted to: BP, AlP, AlAs, AlSb; GaN, GaP, GaAs, GaSb; InN, InP, InAs, InSb, AN, BN.

III-IV material incorporating a first element from group 13 of the periodic table and a second element from group 14 of the periodic table and also including ternary and quaternary materials and doped materials. Nanoparticle material includes but is not restricted to: $B_4C$, $Al_4C_3$, $Ga_4C$.

III-VI material incorporating a first element from group 13 of the periodic table and a second element from group 16 of the periodic table and also including ternary and quaternary materials. Nanoparticle material includes but is not restricted to: $Al_2S_3$, $Al_2Se_3$, $Al_2Te_3$, $Ga_2S_3$, $Ga_2Se_3$, $In_2S_3$, $In_2Se_3$, $Ga_2Te_3$, $In_2Te_3$.

IV-VI material incorporating a first element from group 14 of the periodic table and a second element from group 16 of the periodic table and also including ternary and quaternary materials and doped materials. Nanoparticle material includes but is not restricted to: PbS, PbSe, PbTe, $Sb_2Te_3$, SnS, SnSe, SnTe.

Nanoparticle material incorporating a first element from any group in the transition metal of the periodic table, and a second element from any group of the d-block elements of the periodic table and also including ternary and quaternary materials and doped materials. Nanoparticle material includes but is not restricted to: NiS, CrS, $CuInS_2$, $CuInSe_2$, $CuGaS_2$, $CuGaSe_2$.

QDs of III-V semiconductors have reduced toxicity compared to IIB-VI semiconductor compounds offering a potential substitute to the widely used cadmium-based QDs. Nevertheless, the study and application of III-V semiconductor QDs are limited by the difficulty in their synthesis. Although InP is the most extensively studied semiconductor material within the III-V group, the synthesis of the InP QDs and in general of III-V semiconductors by traditional chemical methods present in the prior art does not yield QDs of the same optical and physical properties as those of most IIB-VI semiconductor nanocrystals, including CdSe and CdS. The QDs made according these traditional chemical methods are characterised by poor electronic properties including relatively low PLQY. These limitations hinder significantly the utilization of heavy metal-free semiconductor QDs in emitting devices. Another concern for the electronic industry is the need of a supply of QDs in multi-gram quantities for the mass production of commercial products and the conventional methods can deliver usually only micro-gram quantities of these materials.

"Capping Agent"—Outermost Particle Layer

The coordination around the atoms on the surface of any core, core-shell or core-multi shell, doped or graded nanoparticle is incomplete and the non-fully coordinated atoms have dangling bonds which make them highly reactive and can lead to particle agglomeration. This problem is overcome by passivating (capping) the "bare" surface atoms with protecting organic groups.

The outermost layer (capping agent) of organic material or sheath material helps to inhibit particle-particle aggregation, further protects the nanoparticle from their surrounding electronic and chemical environments and also provides a mean of chemical linkage to other inorganic, organic or biological material. In many cases, the capping agent is the solvent that the nanoparticle preparation is undertaken in, and consists of a Lewis base compound, or a Lewis base compound diluted in an inert solvent such as a hydrocarbon. There is a lone pair of electrons on the Lewis base capping agent that are capable of a donor type coordination to the surface of the nanoparticle and include mono- or multidentate ligands such as phosphines (trioctylphosphine, triphenylphosphine, t-butylphosphine etc.), phosphine oxides (trioctylphosphine oxide, triphenylphosphine oxide etc.), alkyl phosphonic acids, alkyl-amines (octadecylamine, hexadecylamine, octylamine etc.), aryl-amines, pyridines, long chain fatty acids (myristic acid, oleic acid, undecylenic acid etc.) and thiophenes but is, as one skilled in the art will know, not restricted to these materials.

Surface-modified QDs

The outermost layer (capping agent) of a QD can also consist of a coordinated ligand with additional functional groups that can be used as chemical linkage to other inorganic, organic or biological material, whereby the functional group is pointing away from the QD surface and is available to bond/react/interact with other available molecules, such as amines, alcohols, carboxylic acids, esters, acid chloride, anhydrides, ethers, alkyl halides, amides, alkenes, alkanes, alkynes, allenes, amino acids, azides, groups etc. but is, as one skilled in the art will know, not limited to these functionalised molecules. The outermost layer (capping agent) of a QD can also consist of a coordinated ligand with a functional group that is polymerisable and can be used to form a polymer layer around the particle.

The outermost layer (capping agent) can also consist of organic units that are directly bonded to the outermost inorganic layer such as via an S—S bond between the inorganic surface (ZnS) and a thiol capping molecule. These can also possess additional functional group(s), not bonded to the surface of the particle, which can be used to form a polymer around the particle, or for further reaction/interaction/chemical linkage.

QD Beads (QD-Beads)

The photo-stability of QDs employed in the various aspects of the present disclosure is increased by incorporating the QDs into optically transparent beads. Considering the initial step of incorporating QDs into beads, a first option is to incorporate the QDs directly into the polymer matrices of resin beads. A second option is to immobilise the QDs in polymer beads through physical entrapment. It is possible using these methods to make a population of beads that contain just a single type of QD (e.g. one colour) by incorporating a single type of QD into the beads. Alternatively, it is possible to construct beads that contain 2 or more types of QD (e.g. two or more colours) by incorporating a mixture of two or more types of QD (e.g. material and/or size) into the beads. Such mixed beads can then be combined in any suitable ratio to emit any desirable colour of secondary light following excitation by the primary light emitted by the primary light source (e.g. LED). This is exemplified in FIGS. 5 to 7 which schematically show QD-bead light emitting devices including respectively: a) beads including multi-coloured QDs such that each bead emits white secondary light; b) multiple beads, each bead containing a single colour of QD such that each bead emits light of a single colour but the combination of differently coloured beads produce white secondary light; and c) beads containing a single colour of QD such that a mixture of the beads emits a single colour of secondary light, e.g. red.

Incorporation of QDs During Bead Formation

With regard to the first option, by way of example, hexadecylamine-capped CdSe-based semiconductor nanoparticles can be treated with at least one, more preferably two or more polymerisable ligands (optionally one ligand in excess) resulting in the displacement of at least some of the hexadecylamine capping layer with the polymerisable ligand(s). The displacement of the capping layer with the polymerisable ligand(s) can be accomplished by selecting a polymerisable ligand or ligands with structures similar to that of trioctylphosphine oxide (TOPO), which is a ligand with a known and very high affinity for CdSe-based nanoparticles. It will be appreciated that this basic methodology may be applied to other nanoparticle/ligand pairs to achieve a similar effect. That is, for any particular type of nanoparticle (material and/or size), it is possible to select one or more appropriate polymerisable surface binding ligands by choosing polymerisable ligands comprising a structural motif which is analogous in some way (e.g. has a similar physical and/or chemical structure) to the structure of a known surface binding ligand. Once the nanoparticles have been surface-modified in this way, they can then be added to a monomer component of a number of microscale polymerisation reactions to form a variety of QD-containing resins and beads. Another option is the polymerisation of one or more polymerisable monomers from which the optically transparent medium is to be formed in the presence of at least a portion of the semiconductor nanoparticles to be incorporated into the optically transparent medium. The resulting materials incorporate the QDs covalently and appear highly coloured even after prolonged periods of Soxhlet extraction.

Examples of polymerisation methods that may be used to construct QD-containing beads include suspension, dispersion, emulsion, living, anionic, cationic, RAFT, ATRP, bulk, ring closing metathesis and ring opening metathesis but not exclusive to. Initiation of the polymerisation reaction may be caused by any suitable method which causes the monomers to react with one another, such as by the use of free radicals, light, ultrasound, cations, anions, or heat. A preferred method is suspension polymerisation involving thermal curing of one or more polymerisable monomers from which the optically transparent medium is to be formed. Said polymerisable monomers preferably comprise methyl (meth)acrylate, ethylene glycol dimethacrylate and vinyl acetate. This combination of monomers has been shown to exhibit excellent compatibility with existing commercially available LED encapsulants and has been used to fabricate a light emitting device exhibiting significantly improved performance compared to a device prepared using essentially prior art methodology. Other preferred polymerisable monomers are epoxy or polyepoxide monomers, which may be polymerised using any appropriate mechanism, such as curing with ultraviolet irradiation.

QD-containing microbeads can be produced by dispersing a known population of QDs within a polymer matrix, curing the polymer and then grinding the resulting cured material. This is particularly suitable for use with polymers that become relatively hard and brittle after curing, such as many common epoxy or polyepoxide polymers (e.g. Optocast™ 3553 from Electronic Materials, Inc., USA).

QD-containing beads may be generated simply by adding QDs to the mixture of reagents used to construct the beads. In some instances QDs (nascent QDs) will be used as isolated from the reaction employed to synthesise them and are thus generally coated with an inert outer organic ligand layer. In an alternative procedure a ligand exchange process may be carried out prior to the bead forming reaction. Here one or more chemically reactive ligands (for example this might be a ligand for the QDs which also contains a polymerisable moiety) are added in excess to a solution of nascent QDs coated in an inert outer organic layer. After an appropriate incubation time the QDs are isolated, for example by precipitation and subsequent centrifugation, washed and then incorporated into the mixture of reagents used in the bead forming reaction/process.

Both QD incorporation strategies will result in statistically random incorporation of the QDs into the beads and thus the polymerisation reaction will result in beads containing statistically similar amounts of the QDs. It will be obvious to one skilled in the art that bead size can be controlled by the choice of polymerisation reaction used to construct the beads and additionally once a polymerisation method has been selected bead size can also be controlled by selecting appropriate reaction conditions, e.g. in a suspension polymerisation reaction by stirring the reaction mixture more quickly to generate smaller beads. Moreover the shape of the beads can be readily controlled by choice of procedure in conjunction with whether or not the reaction is carried out in a mould. The composition of the beads can be altered by changing the composition of the monomer mixture from which the beads are constructed. Similarly the beads can also be cross-linked with varying amounts of one or more cross-linking agents (e.g. divinyl benzene). If beads are constructed with a high degree of cross-linking, e.g. greater than 5 mol % cross-linker, it may be desirable to incorporate a porogen (e.g. toluene or cyclohexane) during the reaction used to construct the beads. The use of a porogen in such a way leaves permanent pores within the matrix constituting each bead. These pores may be sufficiently large to allow the ingress of QDs into the bead.

QDs can also be incorporated in beads using reverse emulsion based techniques. The QDs may be mixed with precursor(s) to the optically transparent coating material and then introduced into a stable reverse emulsion containing, for example, an organic solvent and a suitable salt. Following agitation the precursors form microbeads encompassing the QDs, which can then be collected using any appropriate method, such as centrifugation. If desired, one or more additional surface layers or shells of the same or a different optically transparent material can be added prior to isolation of the QD-containing beads by addition of further quantities of the requisite shell layer precursor material(s).

Incorporation of QDs into Prefabricated Beads

In respect of the second option for incorporating QDs into beads, the QDs can be immobilised in polymer beads through physical entrapment. For example, a solution of QDs in a suitable solvent (e.g. an organic solvent) can be incubated with a sample of polymer beads. Removal of the solvent using any appropriate method results in the QDs becoming immobilised within the matrix of the polymer beads. The QDs remain immobilised in the beads unless the sample is resuspended in a solvent (e.g. organic solvent) in which the QDs are freely soluble. Optionally, at this stage the outside of the beads can be sealed. Another option is to physically attach at least a portion of the semiconductor nanoparticles to prefabricated polymeric beads. Said attachment may be achieved by immobilisation of the portion of the semiconductor nanoparticles within the polymer matrix of the prefabricated polymeric beads or by chemical, covalent, ionic, or physical connection between the portion of semiconductor nanoparticles and the prefabricated polymeric beads. Examples of prefabricated polymeric beads comprise polystyrene, polydivinyl benzene and a polythiol.

QDs can be irreversibly incorporated into prefabricated beads in a number of ways, e.g. chemical, covalent, ionic, physical (e.g. by entrapment) or any other form of interaction. If prefabricated beads are to be used for the incorporation of QDs, the solvent accessible surfaces of the bead may be chemically inert (e.g. polystyrene) or alternatively they may be chemically reactive/functionalised (e.g. Merrifield's Resin). The chemical functionality may be introduced during the construction of the bead, for example by the incorporation of a chemically functionalised monomer, or alternatively chemical functionality may be introduced in a post bead construction treatment for example by conducting a chloromethylation reaction. Additionally chemical functionality may be introduced by a post bead construction polymeric graft or other similar process whereby chemically reactive polymer(s) are attached to the outer layers/accessible surfaces of the bead. More than one such post construction derivatisation process may be carried out to introduce chemical functionality onto/into the bead.

As with QD incorporation into beads during the bead forming reaction, i.e. the first option described above, the pre-fabricated beads can be of any shape, size and composition and may have any degree of cross-linker and may contain permanent pores if constructed in the presence of a porogen. QDs may be imbibed into the beads by incubating a solution of QDs in an organic solvent and adding this solvent to the beads. The solvent must be capable of wetting the beads and in the case of lightly crosslinked beads, preferably 0-10% crosslinked and most preferably 0-2% crosslinked the solvent should cause the polymer matrix to swell in addition to solvating the QDs. Once the QD-containing solvent has been incubated with the beads, it is removed (for example by heating the mixture and causing the solvent to evaporate) and the QDs become embedded in the polymer matrix constituting the bead or alternatively by the addition of a second solvent in which the QDs are not readily soluble but which mixes with the first solvent causing the QDs to precipitate within the polymer matrix constituting the beads. Immobilization may be reversible if the bead is not chemically reactive or else if the bead is chemically reactive the QDs may be held permanently within the polymer matrix, by chemical, covalent, ionic, or any other form of interaction.

Incorporation of QDs into Sol-Gels to produce Glass

Optically transparent media which are sol-gels and glasses that are intended to incorporate QDs may be formed in an analogous fashion to the method used to incorporate QDs into beads during the bead forming process as described above. For example, a single type of QD (e.g. one colour) may be added to the reaction mixture used to produce the sol-gel or glass. Alternatively, two or more types of QD (e.g. two or more colours) may be added to the reaction mixture used to produce the sol-gel or glass. The sol-gels and glasses produced by these procedures may have any shape, morphology or 3-dimensional structure. For example, the particles may be spherical, disc-like, rod-like, ovoid, cubic, rectangular or any of many other possible configurations.

Stability-Enhancing Additives

By incorporating QDs into beads in the presence of materials that act as stability-enhancing additives, and optionally providing the beads with a protective surface coating, migration of deleterious species, such as moisture, oxygen and/or free radicals, is eliminated or at least reduced, with the result of enhancing the physical, chemical and/or photo-stability of the semiconductor nanoparticles.

An additive may be combined with "naked" semiconductor nanoparticles and precursors at the initial stages of the production process of the beads. Alternatively, or additionally, an additive may be added after the semiconductor nanoparticles have been entrapped within the beads.

The additives which may be added singly or in any desirable combination during the bead formation process can be grouped according to their intended function as follows:

Mechanical sealing: Fumed silica [e.g., CAB-O-SIL® (Cabot Corporation, Boston, Mass. 02210)], ZnO, $TiO_2$, ZrO, Mg stearate, Zn Stearate, all used as a filler to provide mechanical sealing and/or reduce porosity;

Capping agents: Tetradecyl phosphonic acid (TDPA), oleic acid, stearic acid, polyunsaturated fatty acids, sorbic acid. Zn methacrylate, Mg stearate, Zn Stearate, isopropyl myristate. Some of these have multiple functionality and can act as capping agents, free radical scavengers and/or reducing agents;

Reducing agents: Ascorbic acid palmitate, alpha tocopherol (vitamin E), octane thiol, butylated hydroxyanisole (BHA), butylated hydroxytoluene (BHT), gallate esters (propyl, lauryl, octyl and the like), and a metabisulfite (e.g. the sodium or potassium salt);

Free radical scavengers: benzophenones; and

Hydride reactive agents: 1,4-butandiol, 2-hydroxyethyl methacrylate, allyl methacrylate, 1,6 heptadiene-4-ol, 1,7 octadiene, and 1,4 butadiene.

The selection of the additive or additives for a particular application will depend upon the nature of the semiconductor nanoparticle material (e.g. how sensitive the nanoparticle material is to physical, chemical and/or photo-induced degradation), the nature of the primary matrix material (e.g. how porous it is to potentially deleterious species, such as free-radicals, oxygen, moisture etc), the intended function of the final material or device which will contain the primary particles (e.g. the operating conditions of the material or device), and the process conditions required to fabricate said final material or device. With this in mind, one or more appropriate additives can be selected from the above five lists to suit any desirable semiconductor nanoparticle application.

Bead Surface Coating Materials

Once the QDs are incorporated into the beads, the formed QD-beads can be further coated with a suitable material to provide each bead with a protective barrier to prevent the passage or diffusion of potentially deleterious species, e.g. oxygen, moisture or free radicals, from the external environment through the bead material to the semiconductor nanoparticles. As a result, the semiconductor nanoparticles are less sensitive to their surrounding environment and the various processing conditions typically required to utilise the nanoparticles in applications such as the fabrication of phosphor sheets and devices incorporating such sheets.

The coating is preferably a barrier to the passage of oxygen or any type of oxidising agent through the bead material. The coating may be a barrier to the passage of free radical species, and/or is preferably a moisture barrier so that moisture in the environment surrounding the beads cannot contact the semiconductor nanoparticles incorporated within the beads.

The coating may provide a layer of coating material on a surface of the bead of any desirable thickness provided it affords the required level of protection. The surface layer coating may be around 1 to 10 nm thick, up to around 400 to 500 nm thick, or more. Preferred layer thicknesses are in the range 1 nm to 200 nm, more preferably around 5 to 100 nm.

The coating can comprise an inorganic material, such as a dielectric (insulator), a metal oxide, a metal nitride or a silica-based material (e.g. a glass).

The metal oxide may be a single metal oxide (i.e. oxide ions combined with a single type of metal ion, e.g. $Al_2O_3$), or may be a mixed metal oxide (i.e. oxide ions combined with two or more types of metal ion, e.g. $SrTiO_3$). The metal ion(s) of the (mixed) metal oxide may be selected from any suitable group of the periodic table, such as group 2, 13, 14 or 15, or may be a transition metal, d-block metal, or lanthanide metal.

Preferred metal oxides are selected from the group consisting of $Al_2O_3$, $B_2O_3$, $Co_2O_3$, $Cr_2O_3$, $CuO$, $Fe_2O_3$, $Ga_2O_3$, $HfO_2$, $In_2O_3$, $MgO$, $Nb_2O_5$, $NiO$, $SiO_2$, $SnO_2$, $Ta_2O_5$, $TiO_2$, $ZrO_2$, $Sc_2O_3$, $Y_2O_3$, $GeO_2$, $La_2O_3$, $CeO_2$, $PrO_x$ (x=appropriate integer), $Nd_2O_3$, $Sm_2O_3$, $EuO_y$ (y=appropriate integer), $Gd_2O_3$, $Dy_2O_3$, $Ho_2O_3$, $Er_2O_3$, $Tm_2O_3$, $Yb_2O_3$, $Lu_2O_3$, $SrTiO_3$, $BaTiO_3$, $PbTiO_3$, $PbZrO_3$, $Bi_mTi_nO$ (m=appropriate integer; n=appropriate integer), $Bi_aSi_bO$ (a=appropriate integer; b=appropriate integer), $SrTa_2O_6$, $SrBi_2Ta_2O_9$, $YScO_3$, $LaAlO_3$, $NdAlO_3$, $GdScO_3$, $LaScO_3$, $LaLuO_3$, $Er_3Ga_5O_{13}$.

Preferred metal nitrides may be selected from the group consisting of $BN$, $AlN$, $GaN$, $InN$, $Zr_3N_4$, $Cu_2N$, $Hf_3N_4$, $SiN_c$ (c=appropriate integer), $TiN$, $Ta_3N_5$, $Ti-Si-N$, $Ti-Al-N$, $TaN$, $NbN$, $MoN$, $WN_d$ (d=appropriate integer), $WN_eC_f$ (e=appropriate integer; f=appropriate integer).

The inorganic coating may comprise silica in any appropriate crystalline form.

The coating may incorporate an inorganic material in combination with an organic or polymeric material, e.g., an inorganic/polymer hybrid, such as a silica-acrylate hybrid material.

The coating can comprise a polymeric material which may be a saturated or unsaturated hydrocarbon polymer, or may incorporate one or more heteroatoms (e.g. O, S, N, halo) or heteroatom-containing functional groups (e.g. carbonyl, cyano, ether, epoxide, amide and the like).

Examples of preferred polymeric coating materials include acrylate polymers (e.g. polymethyl(meth)acrylate, polybutylmethacrylate, polyoctylmethacrylate, alkylcyano-acryaltes, polyethyleneglycol dimethacrylate, polyvinylacetate etc), epoxides (e.g., EPOTEK 301 A+B Thermal curing epoxy, EPOTEK OG112-4 single pot UV curing epoxy, or EX0135A and B Thermal curing epoxy), polyamides, polyimides, polyesters, polycarbonates, polythioethers, polyacrylonitryls, polydienes, polystyrene polybutadiene copolymers (Kratons), pyrelenes, poly-para-xylylene (parylenes), polyetheretherketone (PEEK), polyvinylidene fluoride (PVDF), polydivinyl benzene, polyethylene, polypropylene, polyethylene terephthalate (PET), polyisobutylene (butyl rubber), polyisoprene, and cellulose derivatives (methyl cellulose, ethyl cellulose, hydroxypropylmethyl cellulose, hydroxypropylmethylcellulose phthalate, nitrocellulose), and combinations thereof.

Aspects of the present disclosure relate to a phosphor layer or sheet made of QDs dispersed in a polymeric matrix in the form of beads. These QD-containing beads have a number of advantages. The beads can prevent the aggregation of the QDs and lead to emitting layers with improved performance. The beads can be made by a simple process that avoids the use of harsh conditions and therefore limits the potential damages that can occur to the QDs during their incorporation. The result is that the QDs embedded in the beads retain their original electronic properties, with the additional benefits of increased protection compared to the bare dots from the surrounding chemical environment and photo-oxidation. This results in a greater tolerance to the processing conditions necessary for incorporation into solid state structures which can translate into a reduction in the overall manufacturing costs. The ability to incorporate the QDs into variety of polymers provides the ability to improve the dispersibility and processability of the QD materials in a wide range of resins (both hydrophobic and hydrophilic), opening up new opportunities for the fabrication of phosphor layers in applications such as lighting and display technology.

EXPERIMENTAL SECTION

Set out below is a description of methods for producing QDs (including heavy metal-free QDs), their incorporation into beads, the formulation of QD-bead containing inks in accordance with aspects of the present disclosure and methods for the fabrication of QD phosphor sheets, layers or films from QD-beads in accordance with further aspects of the present disclosure.

Reference Example 1

Preparation of CdSe/ZnS Core/Shell QDs

Preparation of CdSe Core QDs

Hexadecylamine (HDA, 500 g) was placed in a three-neck round bottomed flask and degassed by heating to 120° C. under a dynamic vacuum for >1 hour. The solution was then cooled to 60° C. and $[HNEt_3]_4[Cd_{10}Se_4(SPh)_{16}]$ (0.718 g, 0.20 mmols) was added through a side-port under a strong flow of nitrogen. TOPSe and $Me_2Cd.TOP$ (4 mmols each) were added dropwise into the reaction vessel, the temperature was increased to 110° C. and the reaction was allowed to stir for 2 hours after which time the solution was of a deep yellow colour. Further dropwise additions of equimolar amounts of TOPSe and $Me_2Cd.TOP$ were carried out while the temperature was progressively increased at a rate of 0.2° C./min. In total 42 mmols of TOPSe and 42 mmols of $Me_2Cd.TOP$ were used. The reaction was stopped when the PL emission maximum had reached ~600 nm, by cooling to 60° C. followed by addition of 300 mL of dry ethanol or acetone. This produced a precipitation of deep red particles, which were further isolated by filtration. The resulting CdSe QDs were recrystallized by re-dissolving them in toluene, filtering them through Celite followed by re-precipitation with warm ethanol to remove any excess of HDA and any un-reacted sub-products. This produced 10.10 g of HDA-capped CdSe QDs with luminescence emission maximum=585 nm and FWHM (full width at half maximum)=35 nm.

Growth of a ZnS shell on CdSe Core QDs

HDA (800 g) was placed in a three neck round-bottom flask, dried and degassed by heating to 120° C. under a dynamic vacuum for >1 hour. After the solution was then cooled to 60° C. 9.23 g of CdSe QDs as prepared above were added. The HDA was then heated to 220° C. before adding a total of 20 mL of a 0.5 M solution of $Me_2Zn.TOP$ and 20 mL of a 0.5 M solution of sulfur in octylamine by dropwise injections. Three alternate injections of 3.5 mL, 5.5 mL and 11.0 mL of each solution were made, whereby initially 3.5 mL of sulfur was added dropwise until the intensity of the PL maximum was near zero. Then 3.5 mL of $Me_2Zn.TOP$ was added dropwise until the intensity of the PL maximum had reached a maximum. This cycle was repeated with the PL maximum reaching a higher intensity after each cycle. After a PL maximum intensity was reached on the last cycle, additional shelling reagents were added until the PL intensity was between 5-10% below its maximum value, and the reaction was allowed to anneal at 150° C. for 1 hour. The reaction mixture was then allowed to cool to 60° C. whereupon 300 mL of dry "warm" ethanol was added which resulted in the precipitation of particles. The resulting CdSe/ZnS QDs were re-dissolved in toluene and filtered through Celite followed by re-precipitation from warm ethanol to remove any excess HDA. This produced 12.08 g of HDA-capped CdSe/ZnS core/shell QDs with luminescence emission maximum=590 nm and FWHM=36 nm (see FIG. 8). The photoluminescence quantum yield efficiencies (PLQY) of the core/shell materials at this stage range from 50 to 90%.

Reference Example 2

Preparation of InP/ZnS Core/Shell QDs

Preparation of InP Core QDs (400-800 nm emission)

Di-butyl ester (100 mL) and myristic acid (10.1 g) were placed in a three-neck flask and degassed at 70° C. under vacuum for one hour. After this period, nitrogen was introduced and the temperature increased to 90° C. ZnS molecular cluster $[Et_3NH]_4[Zn_{10}S_4(SPh)_{16}]$ (4.7 g) was added and the mixture allowed to stir for 45 minutes. The temperature was then increased to 100° C. followed by the dropwise addition of Indium myristate, $In(MA)_3$ (1 M in ester, 15 mL) followed by $(TMS)_3P$ (1 M in ester, 15 mL). The reaction mixture was allowed to stir while increasing the temperature to 140° C. At 140° C., further dropwise additions of $In(MA)_3$ (1 M, 35 mL) (left to stir for 5 min) and $(TMS)_3P$ (1 M, 35 mL) were made. The temperature was then slowly increased to 180° C. and further dropwise additions of $In(MA)_3$ (1 M, 55 mL) followed by $(TMS)_3P$ (1 M, 40 mL) were made. By addition of the precursor in the manner described above InP QDs could be grown with the emission peak position gradually increasing from 500 nm up to 750 nm, whereby the reaction can be stopped when the desired emission peak position has been reached and left to stir at this temperature for half an hour. After this period, the temperature was decreased to 160° C. and the reaction mixture was left to anneal for up to 4 days (at a temperature of 20 to 40° C. below that of the reaction). A UV lamp was also used at this stage to aid the annealing process.

The nanoparticles were isolated by the addition of dried degassed methanol (approx. 200 mL) via cannula techniques. The precipitate was allowed to settle and then methanol was removed via cannula with the aid of a filter stick. Dried degassed chloroform (approx. 10 mL) was added to wash the solid. The solid was left to dry under vacuum for 1 day. This produced 5.60 g of InP core nanoparticles with luminescence emission maximum=630 nm and FWHM=70 nm.

Post-Operative Treatments of InP Core QDs

The PLQY of the InP QDs prepared by the method above was increased by treatment with dilute hydrofluoric acid (HF) acid. The QDs were dissolved in anhydrous degassed chloroform (~270 mL) and a 50 mL portion was withdrawn and placed in a polypropylene flask. The HF solution was prepared by injecting with a disposable polypropylene syringe 3 mL of a 60% w/w HF solution in water in 17 mL of pre-degassed THF.

Reference Example 3

Incorporation of QDs into Suspension Polymeric Beads

1% wt/vol polyvinyl acetate (PVA) aqueous solution was prepared by stirring for 12 hours followed by extensive degassing by bubbling nitrogen through the solution for a minimum of 1 hour. The monomers, methyl methacrylate and ethylene glycol dimethacrylate, were also degassed by nitrogen bubbling and used with no further purification. The initiator AIBN (0.012 g) was placed into the reaction vessel and put under three vacuum/nitrogen cycles to ensure no oxygen was present.

CdSe/ZnS core/shell QDs as prepared above were added to the reaction vessel as a solution in toluene and the solvent was removed under reduced pressure. Degassed methyl methacrylate (0.98 mL) was then added followed by degassed ethylene glycol dimethacrylate (0.15 mL). The mixture was then stirred at 800 rpm for 15 minutes to ensure complete dispersion of the QDs within the monomer mixture. The solution of 1% PVA (10 mL) was then added and the reaction stirred for 10 minutes to ensure the formation of the suspension. The temperature was then raised to 72° C. and the reaction allowed to proceed for 12 hours.

The reaction mixture was then cooled to room temperature and the beaded product washed with water until the washings ran clear followed by methanol (100 mL), methanol/tetrahydrofuran (1:1, 100 mL), tetrahydrofuran (100 mL), tetrahydrofuran/dichloromethane (1:1, 100 mL), dichloromethane (100 mL), dichloromethane/tetrahydrofuran (1:1, 100 mL), tetrahydrofuran (100 mL), tetrahydrofuran/methanol (1:1, 100 mL), methanol (100 mL). The QD-containing beads (QD-beads) were then dried under vacuum and stored under nitrogen.

Reference Example 4

Adsorption of QDs into Prefabricated Beads

Polystyrene microspheres with 1% divinyl benzene (DVB) and 1% thiol co-monomer were suspended in toluene (1 mL) by shaking and sonication. The microspheres were centrifuged (6000 rpm, approx 1 min) and the supernatant decanted. This was repeated for a second wash with toluene and the pellets then resuspended in toluene (1 mL).

InP/ZnS QDs as prepared above were dissolved (an excess, usually 5 mg of QDs for 50 mg of microspheres) in chloroform (0.5 mL) and filtered to remove any insoluble material. The QD-chloroform solution was added to the microspheres in toluene and shaken on a shaker plate at room temperature for 16 hours to mix thoroughly.

The QD-microspheres were centrifuged to a pellet and the supernatant decanted off, which contained any excess QDs present. The pellet was washed (as above) twice with toluene (2 mL), resuspended in toluene (2 mL), and then transferred directly into a glass vial. The glass vial was placed inside a centrifuge tube, centrifuged and the excess of toluene was decanted.

Reference Example 5

Incorporation of QDs into Silica Beads

InP/ZnS core/shell QDs (70 mg) as prepared above were mixed with 0.1 mL of (3-(trimethoxysilyl)propyl methacrylate (TMOPMA), followed by 0.5 mL of triethylorthosilicate (TEOS) to form a clear solution, which was kept for incubation under $N_2$ overnight. The mixture was then injected into 10 mL of a reverse microemulsion (cyclohexane/CO-520, 18 ml/1.35 g) in 50 mL flask, under stirring at 600 rpm. The mixture was stirred for 15 mins and then 0.1 mL of 4% $NH_4OH$ was injected to start the bead forming reaction. The reaction was stopped the next day and the reaction solution was centrifuged to collect the solid phase. The obtained particles were washed twice with 20 mL cyclohexane and then dried under vacuum.

EXAMPLES

Example 1

Formulation of a Semiconductor QD-bead Ink (Green Silica Beads in Polystyrene/Toluene Matrix)

Inside a nitrogen-filled glovebox toluene (25 g) was injected into a glass vial with a magnetic stirrer and the vial was sealed. The vial was placed on a hot plate and toluene was heated at 60° C. with stirring at 250 rpm for 5 min before a predetermined amount of the polystyrene resin (8.3g) was added. Once all polystyrene resin was dissolved the speed of the stirrer was reduced down to 150 rpm, the temperature was decreased to 40° C. and the resulting mixture was left to stir for 12 hrs. After this period, inside the nitrogen-filled glove box, 2 g of the latter solution were transferred to a smaller glass vial. A magnetic stirrer was introduced in the vial which was then sealed and placed on a hot plate pre-heated to 60° C. The latter solution was stirred at 250 rpm for 5 minutes before a predetermined amount of InP/ZnS core/shell QD-beads (0.2 g) was added. The resulting mixture was allowed to stir at 60° C. for a period of up to 12 h and was subjected to ultrasound for 5-20 min to aid particle dispersion. The process yielded a transparent green QD-bead ink. The InP/ZnS core/shell QD-beads used in this experiment were characterized by photoluminescence emission maximum PL=544 nm, FWHM=56 nm and PLQY=39%.

Example 2

Formulation of a Semiconductor QD-bead Ink (Red Acrylate Beads in LED Acrylate Matrix)

All work was carried out in a UV-light protected atmosphere. A predetermined amount of initiator Irgacure 819 (6 mg) was placed in a glass vial containing a magnetic stirrer. The vial was then sealed and filled with nitrogen. Trimethylol propane trimethacrylate (0.63 mL) was injected into the vial. The mixture was stirred at 250 rpm for 30 min until all solid was dissolved. Then, a pre-determined amount of the lauryl methacrylate (1.37 mL) was injected into the vial and the mixture was allowed to stir for 1 hour. 200 mg of InP/ZnS core/shell QD-acrylate beads (PLQY=47%, Pl=614 nm, FWHM: 59 nm), was added to the acrylate mixture and allowed to stir under nitrogen for 1 hour to yield an ink of the following characteristics: EQE=48%, Pl=614 nm, FWHM=58 nm.

Example 3

Formulation of a Semiconductor QD-bead Ink (Red Acrylate Beads in Flexible Acrylate Matrix (10% TMPTM, 2% PIB)

All work was carried out in a UV-light protected atmosphere. A predetermined amount of Irgacure 819 (6 mg) was placed in a glass vial containing a magnetic stirrer. The vial was then sealed and filled with nitrogen. Trimethylol propane trimethacrylate (TMPTM) (0.22 mL) was injected into the vial. The mixture was stirred at 250 rpm for 30 min until all solid was dissolved. In parallel, in a nitrogen filled vial 20 w/v % of polyisobutylene (PIB) in lauryl methacrylate (0.18 mL) was added to lauryl methacrylate (1.60 mL) and the mixture allowed to stir for 15 minutes. The resulting polyisobutylene/lauryl methacrylate mixture was added to the initiator/trimethylol propane trimethacrylate mixture and allow to stir for 1 hour to yield a yellowish ink matrix. Then, 200 mg of InP/ZnS core/shell QD-acrylate beads (PLQY%=47%, Pl=614 nm, FWHM: 59 nm) was added to the latter matrix and allowed to stir under nitrogen for 1 hour to yield an ink of the following characteristics: EQE=48%, Pl=614 nm, FWHM=58 nm.

Example 4

Fabrication of a Semiconductor QD-bead Phosphor Sheet (Green Silica Beads in Polystyrene/Toluene Matrix)

A doctor blade system was built as follows: a PET sheet of predetermined dimensions was cleaned with an air gun to remove dust particles. Two spacers of predetermined thickness were taped on to the PET substrate making sure that a constant gap (15 mm) was left between the spacers. The PET substrate was then transferred into a nitrogen-filled glove box. A predetermined volume of a QD-bead ink (0.2 mL) was drop cast on the region between the spacers on the PET substrate using a 2 mL plastic syringe. Using a glass slide as a blade the ink was distributed uniformly between the spacers. The substrate was placed on a hot plate pre-heated at 70° C. and heated for 10 min in order to remove the solvent. The resulting film exhibited noticeable fluorescence under bright ambient light conditions. The optical properties were determined using a spectrofluorometer equipped with an integrating sphere accessory: photoluminescence emission maximum PL=550 nm, FWHM=55 nm and PLQY=31%.

Example 5

Formulation of a Semiconductor QD-bead Phosphor Sheet (Red Acrylate Beads in LED Acrylate Matrix)

Inside a nitrogen-filled glove box a predetermined volume of a QD-bead ink (50 μL, EQE=48%, Pl=614 nm, FWHM=58 nm) was drop cast on to a glass mould (300 μm well) and irradiated with a medium-pressure mercury lamp (45 mW/cm$^2$, 4 minutes) to yield a QD-bead polymer film (EQE=45%, Pl=611 nm, FWHM=58 nm).

Example 6

Formulation of a Semiconductor QD-bead Phosphor Sheet (Red Acrylate Beads in Flexible Acrylate Matrix (10% TMPTM, 2% PIB)

Inside a nitrogen-filled glove box a predetermined volume of a QD-bead ink (50 μL, EQE=48%, Pl=614 nm, FWHM=58 nm) was drop cast on to a glass mould (300 μm well) and irradiated with a medium-pressure mercury lamp (45 mW/cm$^2$, 4 minutes) to yield a QD-bead polymer film (EQE=40%, Pl=607 nm, FWHM=57 nm).

The present disclosure provides QD-containing beads formulated into printable inks that can then be used to fabricate light-emitting sheet, layer or film materials. The methods have been developed so as to be sufficiently flexible and robust to enable QDs capable of emitting light of any desirable wavelength to be processed into light-emitting ('phosphor') layer materials. Such materials may be caused to emit light of the predetermined wavelength upon irradiation with, for example, UV or blue light. The colour of visible light emitted by a phosphor layer can be tuned from green to deep red depending on the size of the QDs and the processes used to incorporate the QDs into the chemically stable beads. The QD-containing beads may contain different sizes and/or types of QDs, thus, for example, a QD-bead may contain QDs of one, two or more different sizes and/or chemical composition. Depending on the number of each type of QD present, the bead will provide a particular colour upon excitation. These properties also allow for colour tuning within the bead by combining different amounts of different colour QDs within specific beads. By modifying the encapsulation process novel functionalities can be imparted to the QDs giving the option to disperse the QDs into a wide range of commercially available resins that are used for fabricating conventional phosphor devices. In addition the size of the beads can be tuned, for example from 50 nm to 0.5 mm in diameter, to control the viscosity of the resulting QD-bead/resin dispersion.

Because of the nature of the encapsulation process, not only is QD aggregation prevented thus yielding a uniform layer, but also the QD surface is not disrupted or significantly modified so that the QDs retain their original electronic properties. In this way an appropriate selection of QDs (size, colour, chemical composition, single or multiple types etc), bead materials and ink formulation can be made at the outset and then used to produce a phosphor sheet to a specific specification. QD-beads have the additional benefits of increased protection compared to "bare" QDs in terms of chemical attack by the surrounding environment (e.g. air, oxygen and moisture) which increases the photostability of the QDs during QD-bead ink formulation and phosphor sheet formation, and also during the subsequent incorporation of the phosphor sheet into the final light emitting device to ensure that the optical performance of the final device is as good as possible.

The invention claimed is:
1. A light emitting device comprising:
a light emitting diode;
a light diffuser in spaced-apart relation to the light-emitting diode and having a first surface oriented towards the light emitting diode and an opposing second surface oriented away from the light emitting diode; and
a light emitting layer in direct contact with the opposing second surface of the light diffuser and in optical communication with the light diffuser, said light emitting layer comprising a plurality of light emitting particles embedded within a host matrix material, each of said light emitting particles comprising a population of semiconductor nanoparticles embedded within a polymeric encapsulation medium,
wherein the polymeric encapsulation medium comprises a first polymer and the host matrix material comprises a second polymer and the first and second polymers are formed from a reverse emulsion so as to form microbeads encompassing the semiconductor nanoparticles.

2. The light emitting device recited in claim 1, wherein the polymeric encapsulation medium is an acrylate and the host matrix material is an epoxy.

3. The light emitting device recited in claim 2, wherein the host matrix material is cured using ultraviolet radiation.

* * * * *